United States Patent [19]

Hamasaki

[11] Patent Number: 4,968,635
[45] Date of Patent: Nov. 6, 1990

[54] METHOD OF FORMING EMITTER OF A BIPOLAR TRANSISTOR IN MONOCRYSTALLIZED FILM

[75] Inventor: Toshihiko Hamasaki, Kanagawa, Japan

[73] Assignee: Kabushiki Kasiha Toshiba, Kawasaki, Japan

[21] Appl. No.: 245,264

[22] Filed: Sep. 16, 1988

[30] Foreign Application Priority Data

Sep. 18, 1987 [JP] Japan ................................ 62-232284

[51] Int. Cl.⁵ ...................... H01L 21/265; H01L 29/70
[52] U.S. Cl. .......................................... 437/24; 437/26; 437/31
[58] Field of Search .......................... 437/24, 26, 31, 32

[56] References Cited

U.S. PATENT DOCUMENTS

| | | | |
|---|---|---|---|
| 4,351,856 | 9/1982 | Matsui et al. | 357/49 |
| 4,463,492 | 8/1984 | Maeguchi | 437/24 |
| 4,576,851 | 3/1986 | Iwamatsu | 437/173 |

FOREIGN PATENT DOCUMENTS

| | | | |
|---|---|---|---|
| 0028739 | 5/1981 | European Pat. Off. | 437/31 |
| 3527098 | 1/1987 | Fed. Rep. of Germany | 437/24 |
| 53-104156 | 9/1978 | Japan | 437/24 |
| 55-67131 | 5/1980 | Japan | 437/24 |
| 57-99778 | 6/1982 | Japan | 357/23.7 |
| 57-194572 | 11/1982 | Japan | 437/31 |
| 58-25221 | 2/1983 | Japan | 437/24 |
| 58-56417 | 4/1983 | Japan | 437/24 |
| 58-86768 | 5/1983 | Japan | 437/31 |
| 59-1163 | 1/1984 | Japan | 437/31 |
| 61-144018 | 7/1986 | Japan | 437/24 |

OTHER PUBLICATIONS

Chang, IBM Tech. Discl. Bull., vol. 21, No. 7, (Dec. 1978), pp. 2761–2762.
Ghandhi, *VLSI Fabrication Principles*, John Wiley & Sons, Inc., New York, N.Y., (1983), pp. 143–146, 357, 358.

Primary Examiner—Olik Chaudhuri
Attorney, Agent, or Firm—Oblon, Spivak, McClelland, Maier & Neustadt

[57] ABSTRACT

An emitter of a bipolar transistor is formed by depositing a polycrystalline or amorphous film on a substrate and monocrystallizing the deposited film. Further, the base region of the bipolar transistor is formed by ion implantation through the emitter region.

6 Claims, 5 Drawing Sheets

METHOD OF FORMING EMITTER OF A BIPOLAR TRANSISTOR IN MONOCRYSTALLIZED FILM

BACKGROUND OF THE INVENTION

1. Field of the Invention

This invention relates to a method of making a semiconductor device and particularly to improvements in a method for forming a conductive region for applicable to a transistor in a bipolar type integrated circuit devices.

2. Discussion of Background

A typical bipolar transistor comprises a semiconductor substrate having a 1st conductive type (e.g., n-type) epitaxial semiconductor layer at the surface side thereof, in which an n-type region is isolated by an p-n junction or an insulating region to constitute a collector region. A base region is a 2nd conductive type (e.g., p-type) doped region formed in the collector region at the surface of the epitaxial layer by the ion implantation and solid-phase diffusion using the 2nd conductive type impurity, and an emitter region of an n-type doped region is formed in the base region by the ion implantation and solid-phase diffusion using the 1st conductive type impurity.

In this typical bipolar transistor, a width of the 2nd conductive type semiconductor layer (i.e., base) must have a considerably narrower region without greatly increasing the base sheet resistance, in order to greatly improve the properties of the device. However, it is difficult to control and to be narrow the base width by using the ion diffusion etc. as above described conventional method, and it is also very difficult to make a sharp change in the impurity concentration distribution at the p-n junction which is a boundary surface of the 1st conductive type semiconductor layer and the 2nd conductive type semiconductor layer.

SUMMARY OF THE INVENTION

The object of this invention is to provide a method for fabricating semiconductor devices, which method eliminates the aforesaid drawbacks, obtain to sufficiently sharply change in impurity distribution at the p-n junction. Also, it is possible to make the base width very thin without greatly increasing the base sheet resistance of the bipolar transistor.

This is accomplished in the present invention by providing the steps of; forming a polycrystalline or amorphous film, containing a higher concentration of a 1st conductivity type impurity than the impurity concentration of a 1st conductivity type semiconductor substrate, connected to at least a portion of the surface of said semiconductor substrate, then, carrying out the process of monocrystallized of the said polycrystalline or amorphous semiconductor film by solid-phase epitaxial growth using heat treatment; and then, carrying out the process of forming a 2nd conductivity type region on the surface of said 1st conductivity type semiconductor substrate through said monocrystallized semiconductor film by the implantation in said substrate of 2nd conductivity type impurity ions which have a lower impurity concentration than that of said monocrystallized semiconductor film.

DETAILED DESCRIPTION OF THE PREFERRED EMBODIMENT

An embodiment of a method according to the present invention will now be described with reference to the accompanying drawings.

Figure 1A:
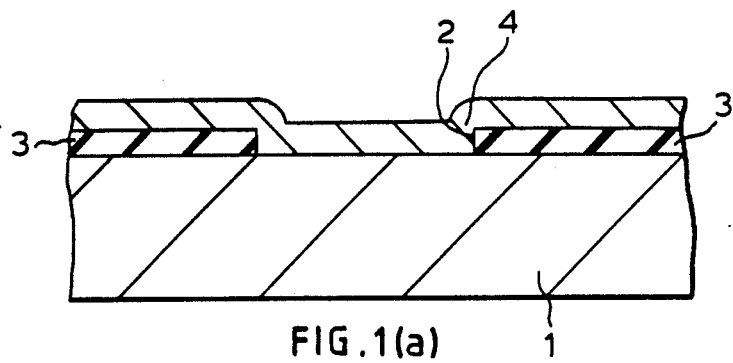
FIG. 1 is illustrations for use in describing the outline of this invention.

First, as shown in FIG. 1(a), insulating films with has an opening 2 is formed in the desired region of the main surface of 1st conductivity type silicon monocrystalline substrate 1. Then, a polycrystalline silicon film or a amorphous film 4 which contains 1st conductivity type impurities is formed.

Next, after heat treatment (at preferrably temperature of the order of 650° C. to 710° C.), silicon film 4 is formed as monocrystallized silicon film 4a.

Figure 1B:
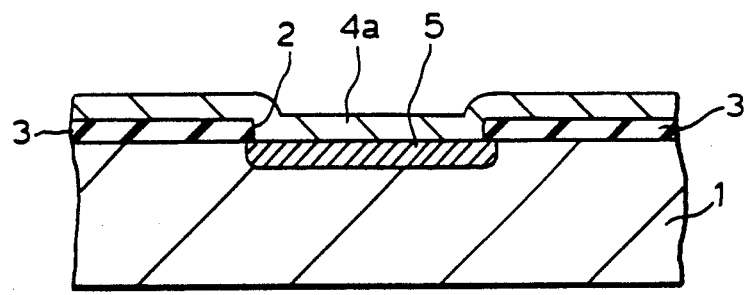

Thereafter, as shown in FIG. 1(b), 2nd conductivity type impurity ions are implanted from the main surface of monocrystalline silicon substrate 1 at a higher concentration than the impurity concentration in monocrystalline silicon substrate 1 but at a lower concentration than the impurity concentration containing in monocrystallized silicon film 4a, and a 2nd conductivity type region 5 is formed on that part of the surface of substrate 1 in which opening 2 is formed.

A semiconductor substrate is deposited a polycrystalline silicon layer thereon, after which is amorphised a surface of the silicon substrate and polycrystalline silicon layer using the implantation of Si ions, P ions or As ions etc., and then heat treatment at comparison of low temperature, the amorphous silicon layer is good monocrystallized, and the impurity concentration of the substrate after heat treatment becomes to change to very sharply.

FIG. 2 is cross sectional views showing the steps of making the semiconductor device applicable to bipolar transistor type which is actually embodiment of this invention.

Figure 2A:
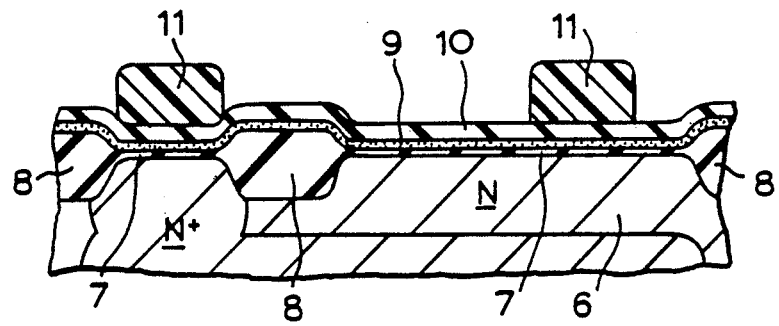
FIG. 2 is process cross-sections for use in describing an embodiment of this invention.

First, as shown in FIG. 2(a), after the formation of a silicon oxide film on the surface of n-type silicon substrate 6 with thickness of 500Å in region 7 and 7000Å in region 8, resist mask 11 is formed after forming a 1000Å polycrystalline silicon film 9 and a 1500Å SiN film 10.

Figure 2B:
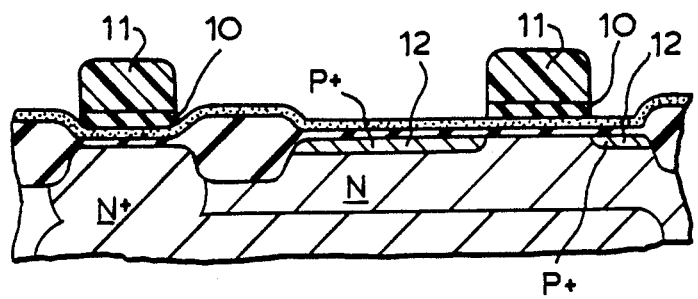

Next, as shown in FIG. 2(b), after selectively removing the SiN film by the reactive ion etching method using resist 11 as a mask, p-type semiconductor region 12 (i.e., the outer base) is formed by the implantation of Boron (B) ions in the surface of n-type silicon substrate 6 with an acceleration voltage of 35 KV and an implantation of $2\times 10^{15} cm^{-2}$.

Figure 2C:
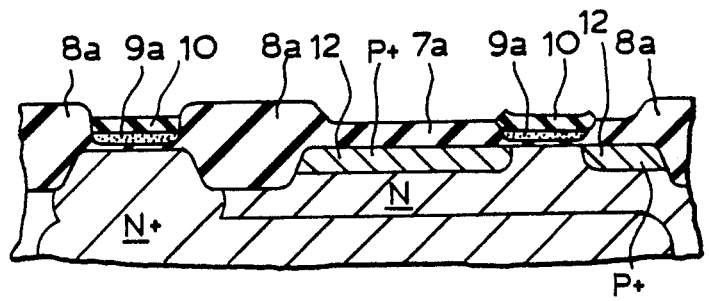

Then, after removing resist 11, oxide films 7a and 8a are formed by oxidizing polycrystalline silicon film 9 by selective oxidation or the like, using SiN film 10 as a mask (See FIG. 2(c)).

Figure 2D:
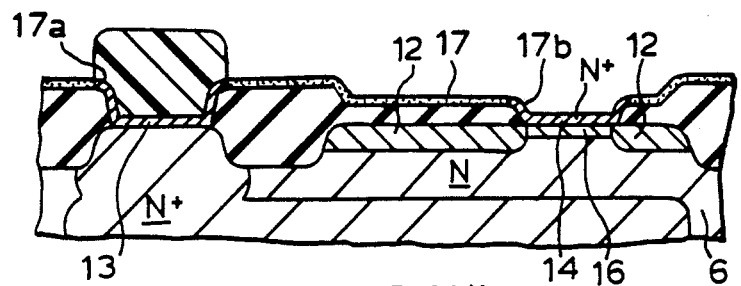

Next, as shown in FIG. 2(d), after removing SiN film 10 and any remaining poly-Si 9a, 500Å etching of the whole surface of the silicon oxide film is carried out and at least opening 13 (i.e., the collector region) and opening 14 (i.e., the emitter region) are provided in the silicon oxide film beneath the portions in which SiN film 10 had been formed in FIG. 2(b), thus exposing silicon substrate 6. Then, after depositing a 700Å polycrystalline silicon film 17, containing $2\times10^{21}cm^{-3}$ of As, on the entire surface, Si ions are implanted in polycrystalline silicon film 17 with an acceleration voltage of 40 KV and an implantation of $1\times10^{15}cm^{-2}$. Following this, monocrystalline silicon films 17a and 17b are formed by monocrystallizing the polycrystalline silicon films on openings 13 and 14 by heat processing for 30 minutes at 700° C. Then, after forming resist mask 15 over opening 13, internal base region 16 is formed on the surface of silicon substrate 6 of opening 14 by implantation of B ions with an acceleration voltage of 20 KV and $2\times10^{14}cm^{-2}$.

Figure 2E:
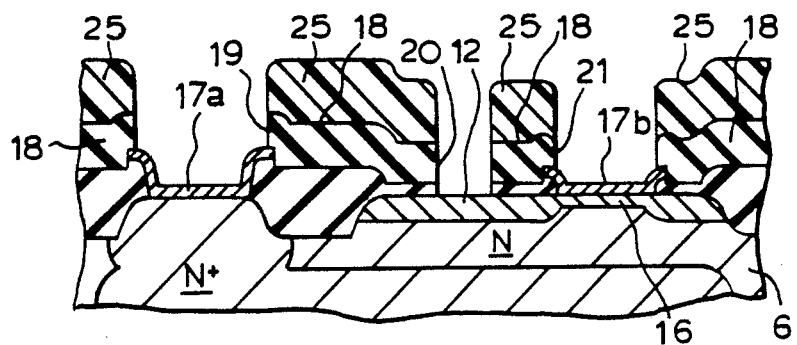

Next, after resist mask 15 has been removed, as shown in FIG. 2(e), heat treatment is carried out at 900° C. for a short period of about 30 seconds and internal base region 16 is activated. Then, polycrystalline silicon 17 which has not been monocrystallized is removed by etching using the resist mask, and 17b and 17a respectively become the emitter region and the collector region. Following this, after silicon oxide film 18 of, say, 2000Å has been deposited by the chemical gas-phase growth method, openings 19, 20 and 21 are provided by reactive ion etching using resist mask 25 so that monocrystallized silicon film 17a, p-type semiconductor region 12 and monocrystallized silicon film 17b are exposed.

Figure 2F:
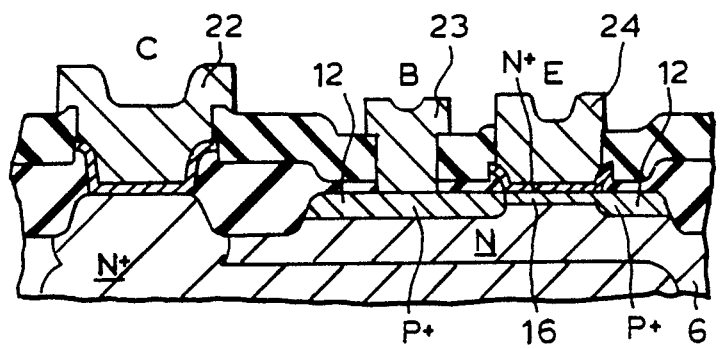

Then, electrodes 22, 23 and 24 of aluminum or the like are formed in openings 19, 20 and 21, as shown in FIG. 2(f), These are respectively the collector, base and emitter electrodes.

Figure 3:
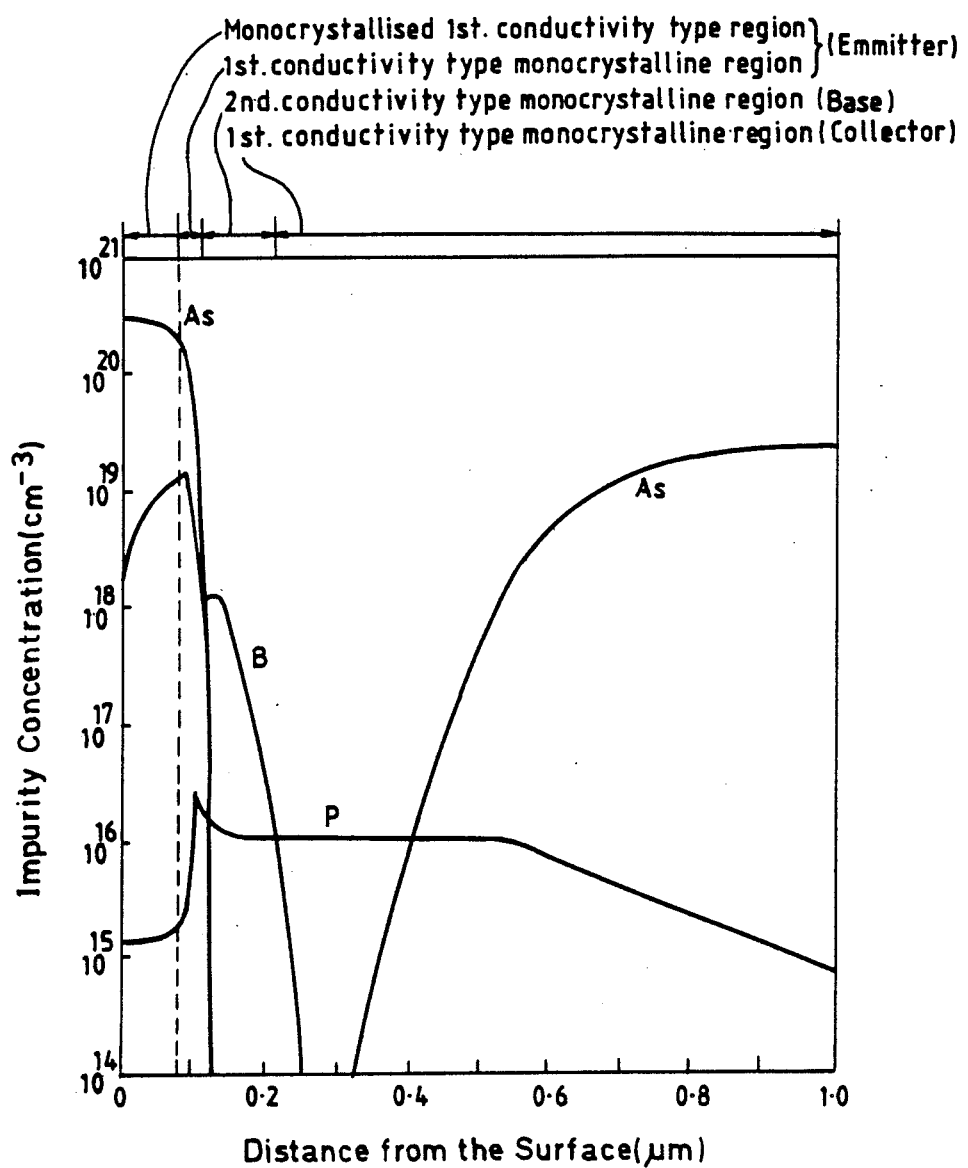
FIG. 3 and FIG. 4 are curves to illustrate the effect of this invention.

FIG. 3 shows the impurity distribution below the emitter of an n-p-n transistor formed by the above processes. Since a base width of 1000Å was achieved and the change of impurity distribution is sharp, the sheet resistance of the internal base could be reduced to 10KΩ/sq.

The 1st conductivity type silicon monocrystalline film is not limited to the above embodiment. For instance, as an alternative method, polycrystalline silicon of thickness 700Å without added impurity is formed by the reduced pressure chemical gas-phase growth method instead of the polycrystalline silicon film 17 containing Arsenic (As) in FIG. 2(d). Then, after implantation of As ions with an acceleration voltage of 65 KV and an implantation of $5\times10^{15}cm^{-2}$, followed by implantation with an acceleration voltage of 30 KV and implantation of $3\times10^{15}cm^{-2}$, the polycrystalline silicon film on openings 13 and 14 are formed as monocrystallized silicon films 17a and 17b in the same way as in FIG. 2 by heat treatment for 30 minutes at 700° C., Thereafter, the formation of an n-p-n transistor is the same as in the previous embodiment.

Figure 4:
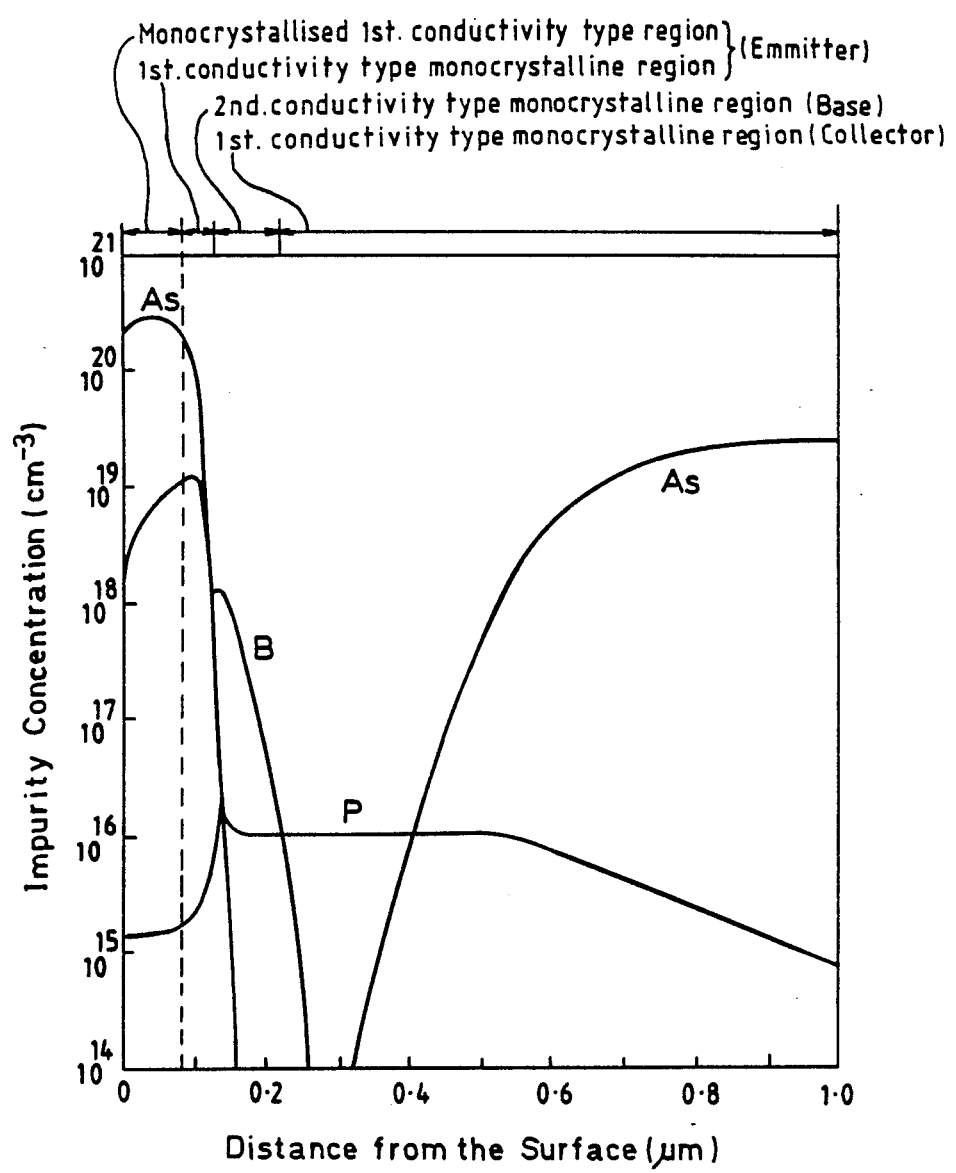

FIG. 4 shows the impurity distribution below the emitter of an n-p-n transistor formed by this process. A base width as narrow as 500Å could be achieved and also the sheet resistance of the internal base could be made as low as 14KΩ/sq.

This invention is not limited in any way to the above embodiments.

For example, in the n-p-n transistor, as was used as the impurity of the emitter region, but it is certain that the effect can be obtained even using phosphorus.

In addition, this invention can be carried out with various modifications, provided they are within the scope of its main purport.

What is claimed is:

1. A method of forming an emitter of a bipolar transistor in a monocrystallized film, comprising the steps of:
    providing a semiconductor substrate being a collector region and having a first conductivity;
    forming an insulating film on said substrate;
    forming an opening portion in said insulating film;
    forming a polycrystalline or amorphous film being an emitter region and having a higher impurity concentration of a first conductivity than the impurity concentration of said substrate;
    monocrystallizing the polycrystalline or amorphous semiconductor film using heat treatment;
    forming a region being a base region and having a lower impurity concentration of a second conductivity than that of said monocrystallized semiconductor film using ion implantation through the emitter region in said opening.

2. The method according to claim 1, wherein said semiconductor substrate is a monocrystalline silicon substrate and said polycrystalline or amorphous semiconductor film is a polycrystalline or amorphous silicon film.

3. Method according to claim 2, wherein said polycrystalline or amorphous silicon film containing the first conductivity type impurity is formed by a chemical gasphase growth method using a gas mixture composed of the 1st conductivity type impurity gas and Si gas.

4. The method according to claim 1, wherein said heat treatment is preformed at a temperature of 650° C. to 710° C.

5. The method of claim 1, wherein said monocrystallizing step further comprises a step of implanting silicon ions into the polycrystalline or amorphous semiconductor film before heat treatment.

6. A method of forming an emitter of a bipolar transistor in a monocrystallized film, comprising the steps of:
    providing a monocrystalline silicon substrate being a collector region and having a first conductivity;
    forming an insulating film on said substrate;
    forming an opening portion in the insulating film;
    forming a polycrystalline silicon film being an emitter region on the substrate;
    amorphizing the polycrystalline silicon film using ion implantation of said first conductivity type impurity;
    monocrystallizing the amorphorized polycrystalline silicon film using heat treatment; and
    forming a base region having a lower impurity concentration of a second conductivity than that of the monocrystallized emitter region using ion implantation through the emitter region in the opening.

* * * * *